United States Patent
Baniecki et al.

(10) Patent No.: US 8,076,705 B2
(45) Date of Patent: Dec. 13, 2011

(54) CAPACITOR DEVICE PROVIDING SUFFICIENT RELIABILITY

(75) Inventors: John D. Baniecki, Kawasaki (JP); Masatoshi Ishii, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 818 days.

(21) Appl. No.: 12/036,691

(22) Filed: Feb. 25, 2008

(65) Prior Publication Data

US 2008/0258191 A1   Oct. 23, 2008

(30) Foreign Application Priority Data

Feb. 26, 2007   (JP) ................... 2007-045550

(51) Int. Cl.
*H01L 21/02* (2006.01)

(52) U.S. Cl. ............ 257/295; 257/E29.164; 438/3
(58) Field of Classification Search ............... 257/295, 257/E29.164; 438/3
See application file for complete search history.

(56) References Cited

U.S. PATENT DOCUMENTS

| 4,990,324 | A | 2/1991 | Tomita et al. |
| 2005/0145908 | A1 * | 7/2005 | Moise et al. ............ 257/295 |

FOREIGN PATENT DOCUMENTS

JP    8-18867 B2    2/1996

OTHER PUBLICATIONS

"Proton conducting alkaline earth zirconates and titanates for high drain electrochemical applications", Kreuer et al., Solid State Ionics (2001), 145(1-4), 295-306.*

Liu et al., "Structure dielectric property relationship for vanadium and scandium doped barium strontium titanate", Acta Materialia (2007) 2647-2657.*

* cited by examiner

*Primary Examiner* — Thao Le
*Assistant Examiner* — Matthew Gordon
(74) *Attorney, Agent, or Firm* — Westerman, Hattori, Daniels & Adrian, LLP

(57) ABSTRACT

A capacitor device includes a dielectric layer configured to have a composition represented as $(Ba_{1-x}, Sr_x)Ti_{1-z}Sc_yO_{3+\delta}$ ($0<x<1$, $0.01<z<0.3$, $0.005<y<0.02$, $-0.5<\delta<0.5$) and an in-plane deformation $\in$ of crystal that satisfies $-0.4<\in<0.4$, an upper electrode and a lower electrode that are placed on respective sides of the dielectric layer, and a substrate on which the upper electrode, the lower electrode, and the dielectric layer are disposed.

10 Claims, 9 Drawing Sheets

FIG.1

| | NO Sc ADDED | Sc ADDED |
|---|---|---|
| | 50.7 % Ti | 43.4 % Ti, 1 % Sc |
| STRESSED LATTICE PARAMETER | 4.02611 | 4.03217 |
| UNSTRESSED LATTICE PARAMETER | 4.00468017 | 4.01480075 |
| IN-PLANE DEFORMATION | 0.005350187 | 0.0016 |

FIG.2

| | Ba | Sr | Ti | Ba/(Ba+Sr) | Ti/(Ba+Sr+Ti) |
|---|---|---|---|---|---|
| 0 % Sc | 31.35 % | 17.59 % | 51.06 % | 0.6406 | 0.5106 |
| 0.4 % Sc | 32.57 % | 17.84 % | 49.58 % | 0.6461 | 0.4958 |
| 1.7 % Sc | 34.57 % | 20.53 % | 44.89 % | 0.6274 | 0.4489 |

100

100A

CAPACITOR DEVICE PROVIDING SUFFICIENT RELIABILITY

CROSS-REFERENCE TO RELATED APPLICATIONS

The present application is based upon and claims the benefit of priority from the prior Japanese Patent Application No. 2007-045550 filed on Feb. 26, 2007, with the Japanese Patent Office, the entire contents of which are incorporated herein by reference.

BACKGROUND OF THE INVENTION

1. Field of the Invention

The disclosures herein relate to a capacitor device having a ferroelectric layer, a semiconductor device having such a capacitor device, and a method of manufacturing such a capacitor device.

2. Description of the Related Art

A ferroelectric layer having a spontaneous polarization is widely used in capacitor devices that serve as decoupling capacitors or that constitute part of semiconductor devices such as DRAM (Dynamic Random Access Memory), for example.

When such capacitor devices are to be made in small size, the area size of the ferroelectric layer needs to be made small. The amount of electric charge stored in a memory device is proportional to the area size of the capacitor devices. When the memory device is to be made in small size or is to be configured to have a large memory volume, therefore, the relative permittivity of the ferroelectric layer needs to be made so large as to increase the volume density of the dielectric layer.

Examples of metallic oxide for use as the ferroelectric layer of a capacitor device include a dielectric material having a perovskite structure such as a barium strontium titanate ($BaSrTiO_3$) (see Japanese Patent Post-Grant Publication No. 8-18867).

Important factors to be considered in order to increase the relative permittivity of such ferroelectric layer include the crystalline characteristics of the ferroelectric layer and the controlling of stress applied to the ferroelectric layer formed in a thin film shape. Treatment temperature at the time of forming a ferroelectric layer may be increased to improve the crystalline characteristics of the ferroelectric layer.

An attempt to increase the temperature for treating a ferroelectric layer may give rise to various problems as follows. An increase in treatment temperature may increase the dielectric loss of the ferroelectric layer. Further, an increase in a leak current through the ferroelectric layer may be brought about, resulting in less reliability as a capacitor device.

Moreover, a high treatment temperature may create strong pulling stress applied to the ferroelectric layer due to a difference in thermal expansion between the substrate made of Si, for example, and the ferroelectric layer. Such stress may create large in-plane deformation in the crystal. If the in-plane deformation of crystal forming a ferroelectric layer becomes large, a decrease in relative permittivity and an increase in leak current are brought about, resulting in the deterioration of electrical characteristics of the ferroelectric layer.

Such stress generated in the ferroelectric layer may be relaxed by selecting a substrate that is thermal expansion matched with the dielectric layer or for epitaxial ferroelectric layer growth having a crystal structure that is lattice-matched with the crystal of the ferroelectric layer. When the selection of a substrate is utilized to relax the stress of a ferroelectric layer, however, a choice of a substrate usable for the forming of a ferroelectric layer will be limited. This method is thus not practical.

What is needed is a capacitor device, a semiconductor device, and a method of making a capacitor device that substantially obviates one or more problems caused by the limitations and disadvantages of the related art.

SUMMARY OF THE INVENTION

In one embodiment, a capacitor device includes a dielectric layer configured to have a composition represented as $(Ba_{1-x}, Sr_x)Ti_{1-z}Sc_yO_{3+\delta}$ ($0<x<1$, $0.01<z<0.3$, $0.005<y<0.02$, $-0.5<\delta<0.5$) and an in-plane deformation $\in$ of crystal that satisfies $-0.4<\in<0.4$, an upper electrode and a lower electrode that are placed on respective sides of the dielectric layer, and a substrate on which the upper electrode, the lower electrode, and the dielectric layer are disposed.

In another embodiment, a semiconductor device includes a semiconductor element formed in a substrate made of a semiconductor material, and a capacitor device coupled to the semiconductor element, the capacitor device including a dielectric layer, an upper electrode, and a lower electrode, the dielectric layer configured to have a composition represented as $(Ba_{1-x}, Sr_x)Ti_{1-z}Sc_yO_{3+\delta}$ ($0<x<1$, $0.01<z<0.3$, $0.005<y<0.02$, $-0.5<\delta<0.5$) and an in-plane deformation $\in$ of crystal that satisfies $-0.4<\in<0.4$, and the upper electrode and the lower electrode being placed on respective sides of the dielectric layer.

In another embodiment, a method of making a capacitor device includes forming a lower electrode on a substrate, forming a dielectric layer having a composition represented as $(Ba_{1-x}, Sr_x)Ti_{1-z}Sc_yO_{3+\delta}$ ($0<x<1$, $0.01<z<0.3$, $0.005<y<0.02$, $-0.5<\delta<0.5$) and an in-plane deformation $\in$ of crystal that satisfies $-0.4<\in<0.4$, and forming an upper electrode on the dielectric layer.

According to at least one embodiment, a capacitor device providing sufficient reliability and large volume density, a semiconductor device having such a capacitor device, and a method of manufacturing such a capacitor device are provided.

BRIEF DESCRIPTION OF THE DRAWINGS

Other objects and further features of the present invention will be apparent from the following detailed description when read in conjunction with the accompanying drawings, in which:

FIG. 1 is a drawing showing differences in the in-plane deformation of crystal depending on the presence/absence of Sc addition;

FIG. 2 is a drawing showing the results of analysis performed by using XRF on a ferroelectric layer;

DESCRIPTION OF THE PREFERRED EMBODIMENTS

Figure 3:
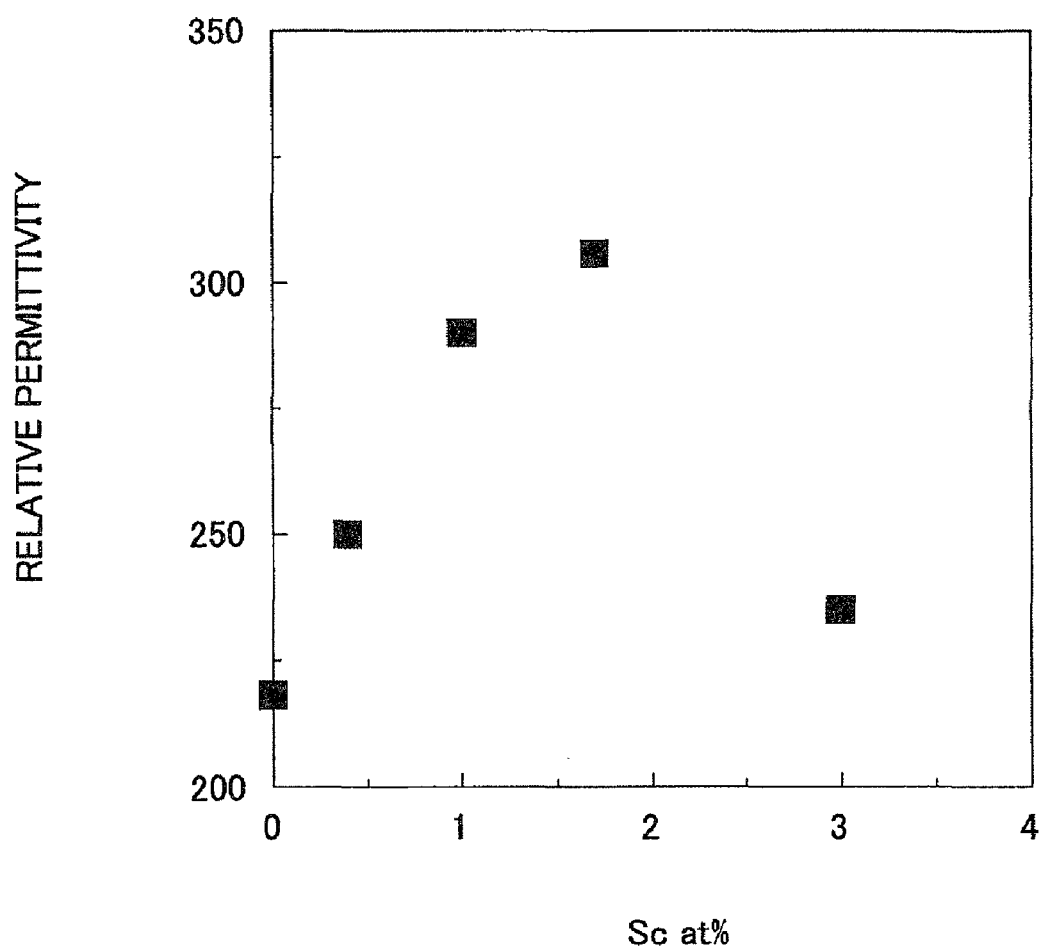
FIG. 3 is a drawing showing the changes of relative permittivity of a ferroelectric layer in response to the addition of Sc.

A capacitor device according to an embodiment of the present invention includes a dielectric layer (ferroelectric layer), an upper electrode and lower electrode that are respectively placed on and beneath the dielectric layer, and a substrate for supporting the upper electrode, the lower electrode, and the dielectric layer.

The crystal that constitutes the dielectric layer (ferroelectric layer) has a perovskite structure. The perovskite structure is represented by the general expression "$ABO_3$". The perovskite structure ideally has a unit lattice of a cubic system, with metal A situated at the vertexes of a cubical crystal, metal B situated at the body center, and oxide O situated at each face center of the cubical crystal surrounding the metal B. The above-noted structure is known to transform easily.

The inventors of the present invention found that when Sc was added to barium strontium titanate having a perovskite structure to form a dielectric layer by use of a particular Sc-modified composition, the relative permittivity of the dielectric layer increased so as to be able to increase its volume density. In this case, further, the leak current in the dielectric layer decreased, and tan δ (dielectric tangent) decreased, resulting in the improvement of reliability of the produced capacitor.

The dielectric layer of the capacitor device according to the embodiment of the present invention is configured to have a composition $(Ba_{1-x}, Sr_x)Ti_{1-z}Sc_yO_{3+\delta}$ (here, $0<x<1$, $0.01<z<0.3$, $0.005<y<0.02$, $-0.5<\delta<0.5$).

Sc is a dopant that is included in a lattice having a perovskite structure represented by the general expression "$ABO_3$". It is believed that Sc may replace one or both of the A site and the B site of the perovskite structure represented as $ABO_3$, for example.

When A/B<1 ((Ba+Sr)/Ti<1), Sc mainly replaces the A site. When A/B>1 ((Ba+Sr)/Ti>1), on the other hand, Sc mainly replaces the B site. When A/B=1, Sc replaces either the A site or the B site equally likely.

Even when A/B<1, however, it is not guaranteed that Sc does not replace the B site. By the same token, even when A/B>1, it is not guaranteed that Sc does not replace the A site.

The atomic valence of Sc included in a perovskite structure is $Sc^{+3}$. Accordingly, Sc becomes a donor-type dopant in the case of A/B<1 whereas Sc becomes an acceptor-type dopant in the case of A/B>1.

The inventors of the present invention found, for the first time, that with Sc serving as an acceptor-type dopant in the case of A/B>1 and mainly replacing Ti, improvements in the electrical characteristics of the dielectric layer (i.e., an increase in relative permittivity, a decrease in leak current, and a decrease in tan δ) were observed. Further, when A/B>1, i.e., when Sc mainly replaces Ti, $z \leq y$ is satisfied in the general expression for a composition of the dielectric layer.

The reasons why the electrical characteristics improve when Sc is added to barium strontium titanate in such a manner as to mainly replace Ti (i.e., in the case of (Ba+Sr)/Ti>1) may be as follows.

It may be conceivable that the addition of Sc under the above-described conditions causes the cell volume of the crystal to increase (i.e., causes the cubic volume of the unit lattice to increase). As the cubic volume of the unit lattice of the crystal increases, its Curie point increases, thereby serving to increase its relative permittivity.

Further, as a result of the increase in the cubic volume of the unit lattice, compressive stress is created in the dielectric layer. When a dielectric layer made of barium strontium titanate is formed on a substrate made of Si, for example, pulling stress is generally generated in the dielectric layer as viewed from the substrate. Especially when the treatment temperature is high, the pulling stress in the dielectric layer increases to induce in-plane deformation in the crystal that constitutes the dielectric layer, which may cause deterioration in the electrical characteristics of the dielectric layer.

The inventors of the present invention found that the addition of Sc to the dielectric layer was able to obviate the problems described above. The addition of Sc to a dielectric layer causes the cubical volume of a unit lattice of the crystal constituting the dielectric layer to increase, thereby relaxing pulling stress that the dielectric layer would exert to the substrate. As a result, in-plane deformation in the crystal can be reduced. Accordingly, the addition of Sc can improve the electrical characteristics of a dielectric layer by increasing the relative permittivity of the dielectric layer, for example.

Similarly to the case of Sc as described above, Y may be added to barium strontium titanate. The atomic valence of Y is $Y^{+3}$. The addition of Y to barium strontium titanate thus has the effect of increasing the cubical volume of a unit lattice of the crystal constituting the dielectric layer to increase its relative permittivity.

Since Sc and Y have different ion radii, however, the size of the increase in the cubical volume of a unit lattice differs between these two. The ion radius of Sc is smaller than that of Y, so that the effect of increasing the cubical volume of a unit lattice is smaller than that of Y. Pulling stress generated in a dielectric layer, for example, greatly varies depending on the film formation conditions (e.g., treatment temperature). Further, the stress in the dielectric layer greatly varies depending on the type of the substrate used. Because of these, the use of Y may result in too strong an effect of increasing the cubical volume of a unit lattice depending on the film formation conditions and the type of the substrate used. In such a case, the desired effect of increasing the relative permittivity cannot be obtained. The choice of Sc over Y as an element to be added, however, increases the effect of increasing the relative permittivity.

FIG. 1 is a drawing showing results obtained by using XRD (X-ray diffraction) to measure the lattice parameters of barium strontium titanate with Sc added ("Sc ADDED") and barium strontium titanate with no Sc added ("NO Sc ADDED"). In this XRD measurement, lattice parameters are obtained from the measurements taken with the incident angle of an X ray being at a predetermined angle (e.g., being at the right angle to the surface that is measured) and with the incident angle being slanted by x degrees from the above-noted predetermined angle (e.g., the right angle). Based on such measurements, the lattice parameters of a lattice substantially experiencing stress (i.e., stressed lattice parameters) and the lattice parameters of a lattice substantially receiving no stress (i.e., unstressed lattice parameters) can be obtained. Such analysis method is sometimes referred to as $\sin^2 x$ analysis. In-plane deformation is then derived from these lattice parameters for each of these two cases.

In this example, the composition of the ferroelectric material with no Sc added was $(Ba_{0.63}, Sr_{0.37})Ti_{1.03}O_3$. The composition ratio of Ti is 50.7 atomic percent in this case, which may certainly be regarded as a "Ti rich" condition. Further, the composition of the ferroelectric material with Sc added was $(Ba_{0.63}, Sr_{0.37})Ti_{0.77}Sc_{0.01}O_3$. The composition ratio of Ti was 43.4 atomic percent in this case, and the composition ratio of Sc was 1 atomic percent.

Referring to FIG. 1, an in-plane deformation with no Sc added is 0.00535 (5.35%) whereas an in-plane deformation with Sc added (1 atomic percent of Sc) is 0.0016 (1.6%). In this manner, it can be confirmed that the addition of Sc serves to reduce in-plane deformation in crystal. The addition of Sc in the above-described example can set in-plane deformation $\in$ of the crystal constituting the dielectric layer such that $-0.4 < \in < 0.4$.

FIG. 2 is a drawing showing results obtained by using XRF (X ray fluorescence analysis) to measure the composition ratio (atomic percent) of Ba, Sr, and Ti under three different conditions of Sc addition for adding Sc to barium strontium titanate, i.e., 0 atomic percent (no addition), 0.4 atomic percent, and 1.7 atomic percent.

As can be seen from FIG. 2, the larger the added amount of Sc, the smaller the composition ratio of Ti is. Namely, this trend shows that added Sc mainly replaces Ti.

FIG. 3 is a drawing showing results obtained by measuring the relative permittivity of a dielectric layer by changing the percentage of Sc added to barium strontium titanate from 0 atomic percent (no addition) to 3 atomic percent.

As can be seen from FIG. 3, the relative permittivity is about 230 when no Sc is added while the relative permittivity increases to 250 in the case that the composition ratio of Sc is 0.5 atomic percent. Further, an increase in the amount of added Sc (i.e., the composition ratio of Sc) causes an increase in the relative permittivity of the dielectric layer until the composition ratio of Sc reaches about 2%. Namely, it can be confirmed that it is possible to increase the relative permittivity of a dielectric layer by adding Sc so as to produce a capacitor device having a large volume density.

Figure 4:
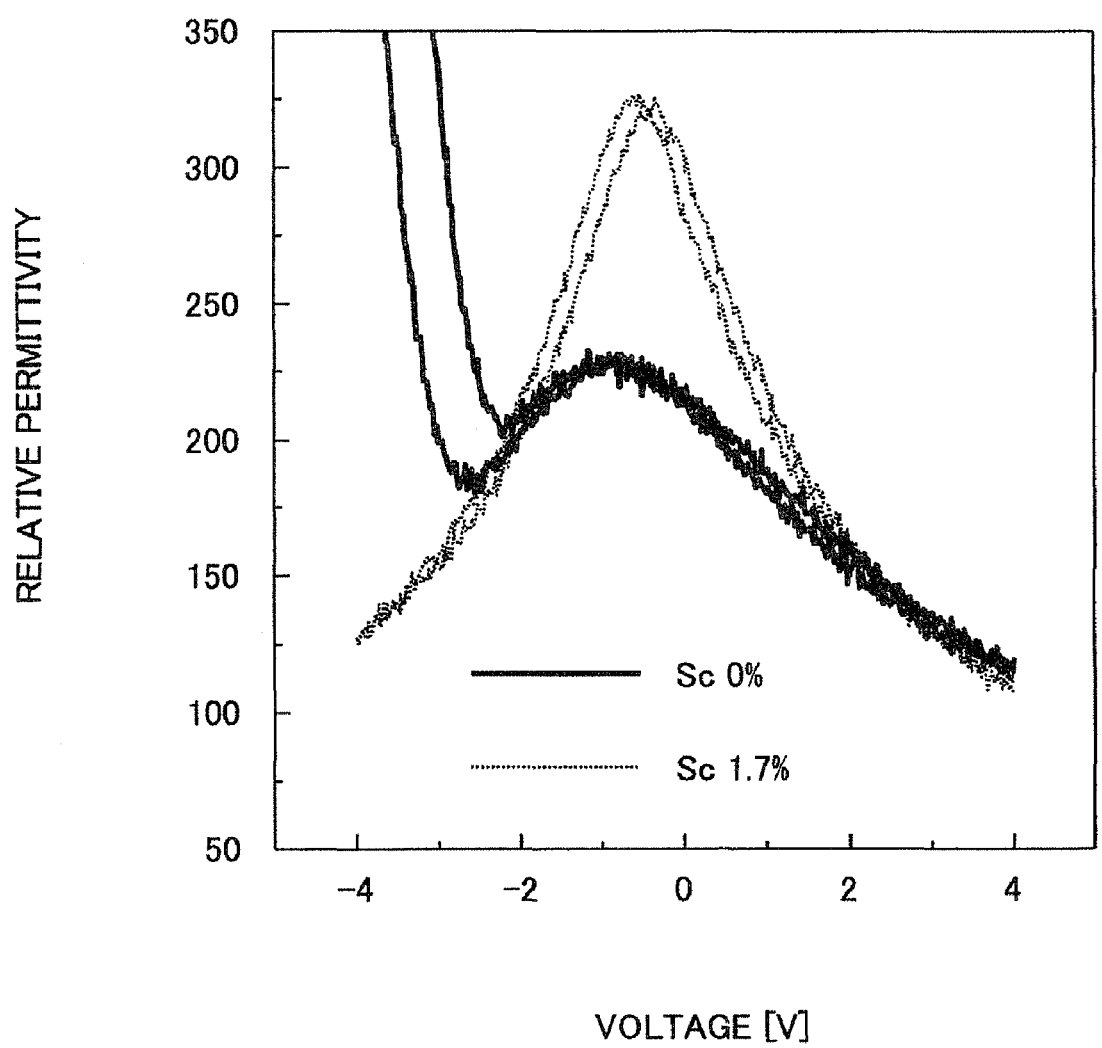
FIG. 4 is a drawing showing differences in the behavior of relative permittivity depending on the presence/absence of Sc addition.

FIG. 4 is a drawing showing the changes of relative permittivity with respect to different voltages applied in the case of no Sc added to barium strontium titanate (shown as "Sc 0%") and in the case of Sc added to barium strontium titanate such as to achieve a composition ratio of 1.7 atomic percent (shown as "Sc 1.7%").

Figure 5:
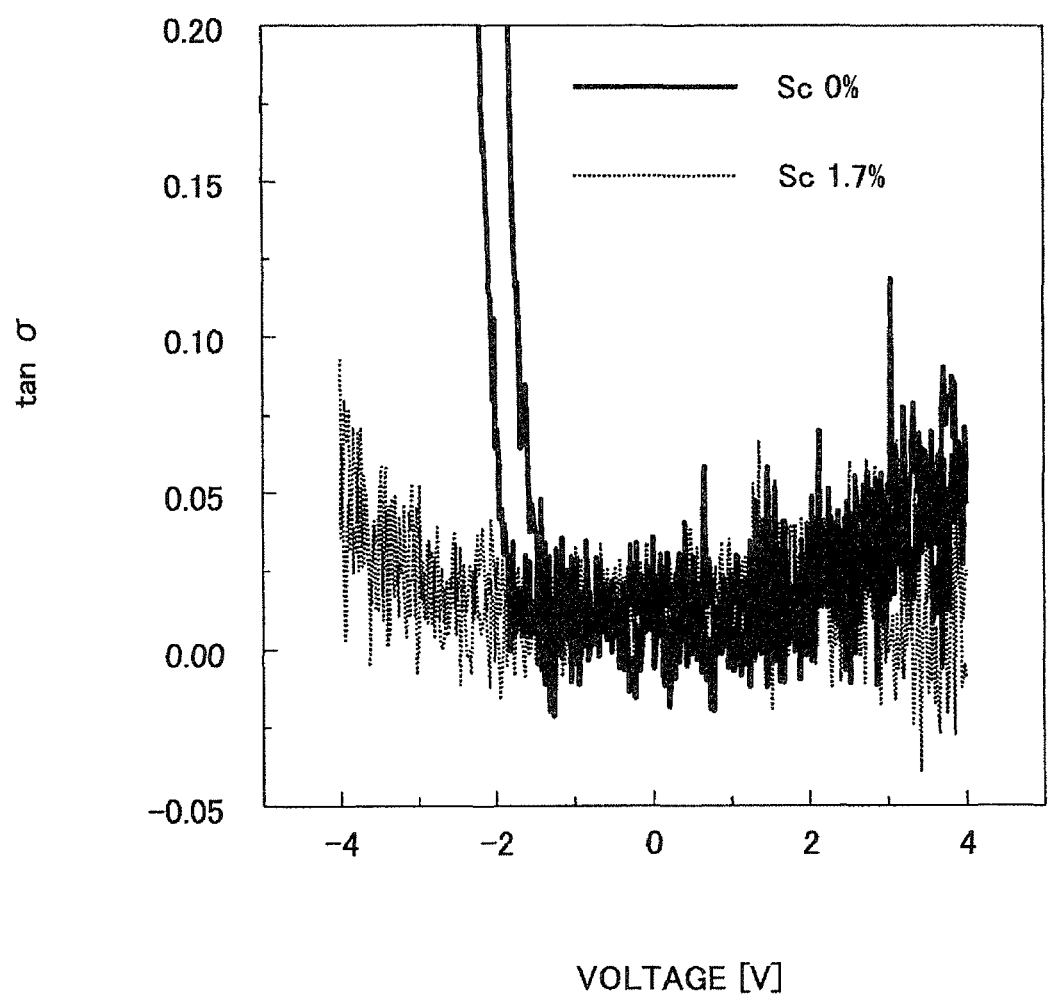
FIG. 5 is a drawing showing differences in the behavior of tan δ depending on the presence/absence of Sc addition.

FIG. 5 is a drawing showing the changes of dielectric tangent (tan δ) with respect to different voltages applied in the case of no Sc added to barium strontium titanate (shown as "Sc 0%") and in the case of Sc added to barium strontium titanate such as to achieve a composition ratio of 1.7 atomic percent (shown as "Sc 1.7%").

As can be seen from FIG. 4 and FIG. 5, the behavior of the relative permittivity with respect to applied voltages greatly differs between the case of positive applied voltages and the case of negative applied voltages when no Sc is added. Further, it can be seen that the value of the dielectric tangent greatly differs between the case of positive applied voltages and the case of negative applied voltages. Namely, the behavior of electric characteristics in response to applied voltages is unstable when no Sc is added, and, also, the value of dielectric loss exhibits large fluctuation when no Sc is added.

When Sc is added, on the other hand, the behavior of the relative permittivity with respect to applied voltages is sym-metric between the case of positive applied voltages and the case of negative applied voltages. Further, it can be seen that the value of the dielectric tangent is stable in response to changes in applied voltage.

Figure 6:
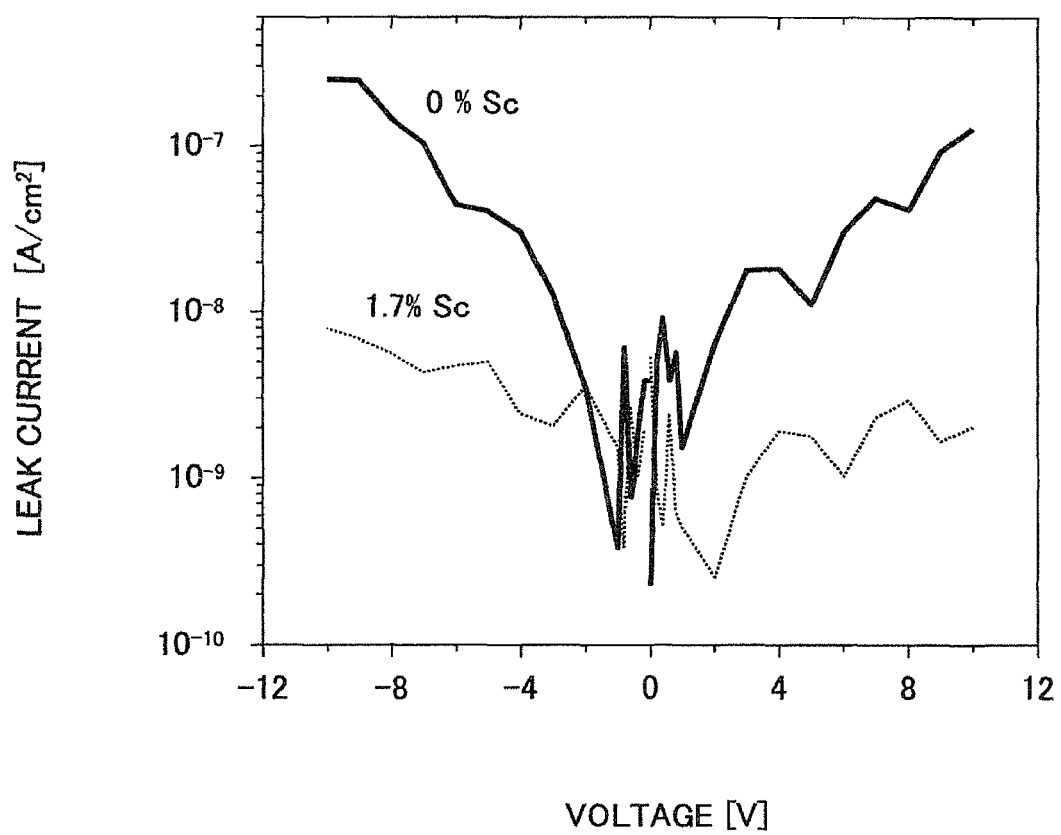
FIG. 6 is a drawing showing differences in the behavior of a leak current depending on the presence/absence of Sc addition.

FIG. 6 is a drawing showing the changes of a leak current with respect to different voltages applied in the case of no Sc added to barium strontium titanate (shown as "Sc 0%") and in the case of Sc added to barium strontium titanate such as to achieve a composition ratio of 1.7 atomic percent (shown as "Sc 1.7%").

As can be seen from FIG. 6, the leak current decreases by adding Sc compared to when no Sc is added. In this manner, the addition of Sc to barium strontium titanate can stabilize the behavior of its electrical characteristics in response to applied voltages, and can decrease the leak current, thereby serving to produce a capacitor device having high reliability In the following, specific examples of a capacitor device having the dielectric layer as described above will be described with reference to the accompanying drawings.

First Embodiment

Figure 7:
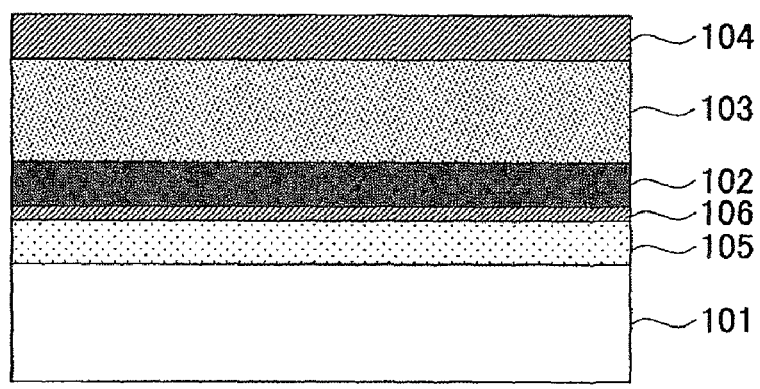
FIG. 7 is an illustrative drawing showing a capacitor device according to a first embodiment.

FIG. 7 is an illustrative drawing showing a cross-sectional view of a capacitor device 100 according to a first embodiment of the present invention. In FIG. 7, a capacitor device 100 includes a dielectric layer (ferroelectric layer) 103, an upper electrode 104 and lower electrode 102 that are respectively placed on and beneath the dielectric layer 103, and a substrate 101 for supporting the upper electrode 104, the lower electrode 102, and the dielectric layer 103.

In the capacitor device 100 according to this embodiment of the present invention, the dielectric layer 103 is configured such that its composition is represented by the general expression $(Ba_{1-x}, Sr_x)Ti_{1-z}Sc_yO_{3+\delta}$ (here, $0<x<1$, $0.01<z<0.3$, $0.005<y<0.02$, $-0.5<\delta<0.5$). With the use of the dielectric layer 103 as described above, the capacitor device 100 provides sufficient reliability and large volume density as previously described.

The dielectric layer 103 is not limited to a particular thickness. Since the dielectric layer 103 is supposed to be formed in a thin film shape, however, the thickness of the dielectric layer 103 may be in the range of 1 nm to 10000 nm. When the capacitor device 100 is used in a semiconductor device, for example, the thickness of the dielectric layer 103 may be in the range of 10 nm to 300 nm.

The dielectric layer 103 may include one or more other elements in addition to the elements described in the above-noted general expression. The dielectric layer 103 may include no less than 1000 ppm of at least one of Al, Fe, Mn, Ni. Co, Mg, Lu, Er, Y, Ho, Dy, Gd, and Tm.

The substrate 101 may be made of semiconductor material such as Si, but is not limited to such an example. The substrate 101 may be made of a material that is selected from the group consisting of Ge, SiGe, GaAs, InAs, and InP. Further, the substrate 101 may be made of a compound derived from the III group or V group of the periodic system other than the elements or compounds described above.

The lower electrode 102 may be made of Pt as a main component, but is not limited to such an example. The lower electrode 102 may be configured to include at least one of Pt, Pd, Ir, Ru, Rh, Re, Os, Au, Ag, Cu, $PtO_x$, $IrO_x$, and $RuO_x$.

The upper electrode 104 may be made of $IrO_2$ as a main component, but is not limited to such an example. The upper electrode 104 may be configured to include at least one of Pd, Ir, Ru, Rh, Re, Os, Au, Ag, Cu, $PtO_x$, $IrO_x$, $RuO_x$, $SrRuO_x$, and $LaNiO_x$.

An insulating layer 105 made of SiO$_2$, for example, may also be provided between the lower electrode 102 and the substrate 101. The insulating layer 105 is not limited to SiO$_2$, and may be made of metal oxide, metal nitride, metal oxynitride, metal oxide having high permittivity, xerogel, or organic resin, or a combination or mixture of at least some of these. The insulating layer 105 may be formed substantially as a single layer, or may be formed as a multiple-layer structure.

An adhesive layer 106 made of TiO$_2$, for example, may also be provided between the lower electrode 102 and the insulating layer 105. The provision of the adhesive layer 106 can increase the binding strength between the insulating layer 105 and the lower electrode 102. The adhesive layer 106 may be configured to include at least one of precious metal, precious metal alloy, a conductive oxide of precious metal, metal oxide, and metal nitride. Specifically, the adhesive layer 106 may be configured to include at least one of Pt, Ir, Zr, Ti, TiO$_x$, IrO$_x$, PtO$_x$, TiN, TiAlN, TaN, and TaSiN. Further, the adhesive layer 106 may be formed substantially as a single layer, or may be formed as a multiple-layer structure.

On the upper electrode 104, a protective layer (passivation layer) made of SiN or SiO$_2$, for example, may also be provided.

A plurality of capacitor devices 100 may be coupled in series or may be coupled in parallel to achieve various coupling configurations and arrangements for use in application. The capacitor device 100 may also be used to implement a filter circuit or a semiconductor device (e.g., DRAM). An example of the capacitor device 100 used in a semiconductor device will later be described with reference to FIG. 10.

Second Embodiment

Figure 8:
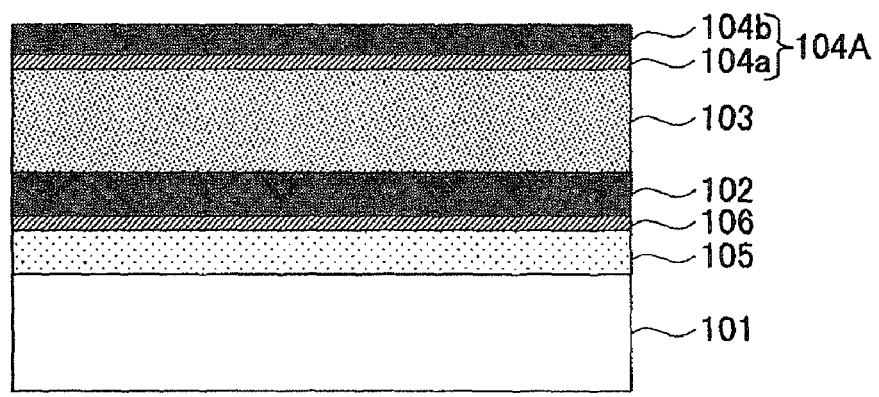
FIG. 8 is an illustrative drawing showing a capacitor device according to a second embodiment.

FIG. 8 is an illustrative drawing showing a cross-sectional view of a capacitor device according to a second embodiment of the present invention. The same elements as those previously described are referred to by the same numerals, and a description thereof will be omitted. The same applies to the subsequent drawings and embodiments.

In FIG. 8, a capacitor device 100A of this embodiment is configured such that an upper electrode 104A corresponding to the upper electrode 104 of the capacitor device 100 of the first embodiment is formed of a plurality of layers. The upper electrode 104A is configure to include a first upper electrode 104a inclusive of a metal oxide layer having direct contact with the dielectric layer 103 and a second upper electrode 104b disposed on the first upper electrode 104a.

The first upper electrode 104a may be made of IrO$_2$ as a main component, but is not limited to such an example. The metal oxide that is the main component of the first upper electrode 104a may include at least one of IrO$_x$, SrRuO$_x$, PtO$_x$, and AuO$_x$.

The second upper electrode 104b may be made of Pt, but is not limited to such an example. The second upper electrode 104b may be configured to have as its main component a metal that is selected from the group consisting of Pt, Pd, Ir, Ru, Rh, Re, Os, Au, Ag, and Cu. With the upper electrode configured to have a multilayer structure comprised of a plurality of layers as described above, it is possible for the capacitor device to provide sufficient reliability and to reduce the resistance of the upper electrode.

Namely, when a metal material having low resistance such as Pt, Pd, Ir, Ru, Rh, Re, Os, Au, Ag, or Cu is used as the upper electrode, a metal oxide layer made of IrO$_x$, SrRuO$_x$, PtO$_x$, or AuO$_x$ may be placed between this metal material and the dielectric layer 103 to achieve sufficient reliability for the capacitor device.

Third Embodiment

In the following, a method of producing a capacitor device will be described by using as an example the capacitor device 100 shown in FIG. 7.

Figure 9A:
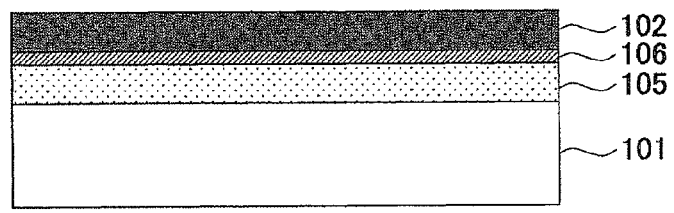
FIG. 9A is an illustrative drawing showing a method of producing a capacitor device according to a third embodiment.
Figure 9B:
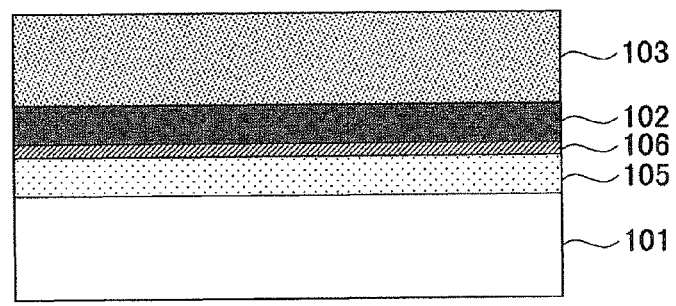
FIG. 9B is an illustrative drawing showing the method of producing a capacitor device according to the third embodiment.
Figure 9C:
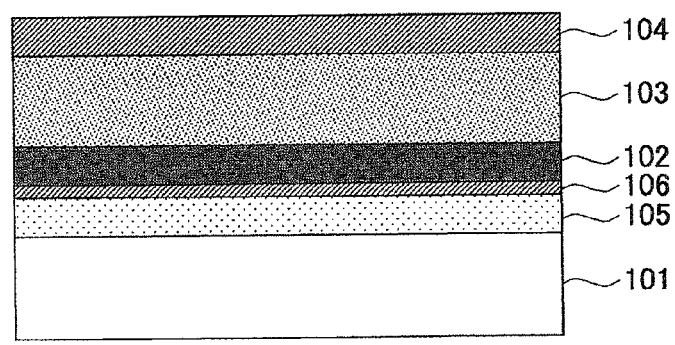
FIG. 9C is an illustrative drawing showing the method of producing a capacitor device according to the third embodiment.

FIGS. 9A through 9C are drawings showing the steps of producing the capacitor device 100 previously described.

In the step shown in FIG. 9A, the insulating layer 105 made of SiO$_2$ is formed through thermal oxidation on the substrate 101 made of silicon (e.g., a silicon wafer). Then, the adhesive layer 106 made of oxidized titanium TiO$_2$ and the lower electrode 102 made of Pt are successively formed on the insulating layer 105 through RF magnetron sputtering. The adhesive layer 106 is formed to a thickness of 20 nm, and the lower electrode 102 is formed to a thickness of 100 nm, for example.

In the step shown in FIG. 9B, the dielectric layer 103 is formed on the lower electrode 102 through RF magnetron sputtering such that its composition is (Ba$_{1-x}$, Sr$_x$)Ti$_{1-z}$S-c$_y$O$_{3+\delta}$ (here, 0<x<1, 0.01<z<0.3, 0.005<y<0.02, −0.5<δ<0.5). In forming the dielectric layer 103, the target having the same composition as a desired thin film composition is used. The film formation conditions may be such that the substrate temperature is 500 degrees Celsius, the RF power 100 W, and the pressure 0.1 Pa, and such that the flow amount ratio of the Ar gas to the O$_2$ gas is 4:1. Further, the dielectric layer 103 is formed to a thickness of 70 nm, for example.

The step of annealing the dielectric layer 103 in an oxidation atmosphere of 100 degrees Celsius to 900 degrees Celsius may be optionally provided according to need after the above-described step of forming the film. Such annealing of the dielectric layer 103 has the effect of further improving the electrical characteristics of the dielectric layer 103.

In the step shown in FIG. 9C, the upper electrode 104 made of IrO$_2$, for example, is formed to a thickness of 100 nm through RF magnetron sputtering on the dielectric layer 103.

Through the steps as described above, the capacitor device 100 shown in FIG. 7 is produced. The dielectric layer 103 may be formed by use of another method in place of the sputtering method. For example, Sol gel processing, the CVD method, or the like may be used.

Fourth Embodiment

Figure 10:
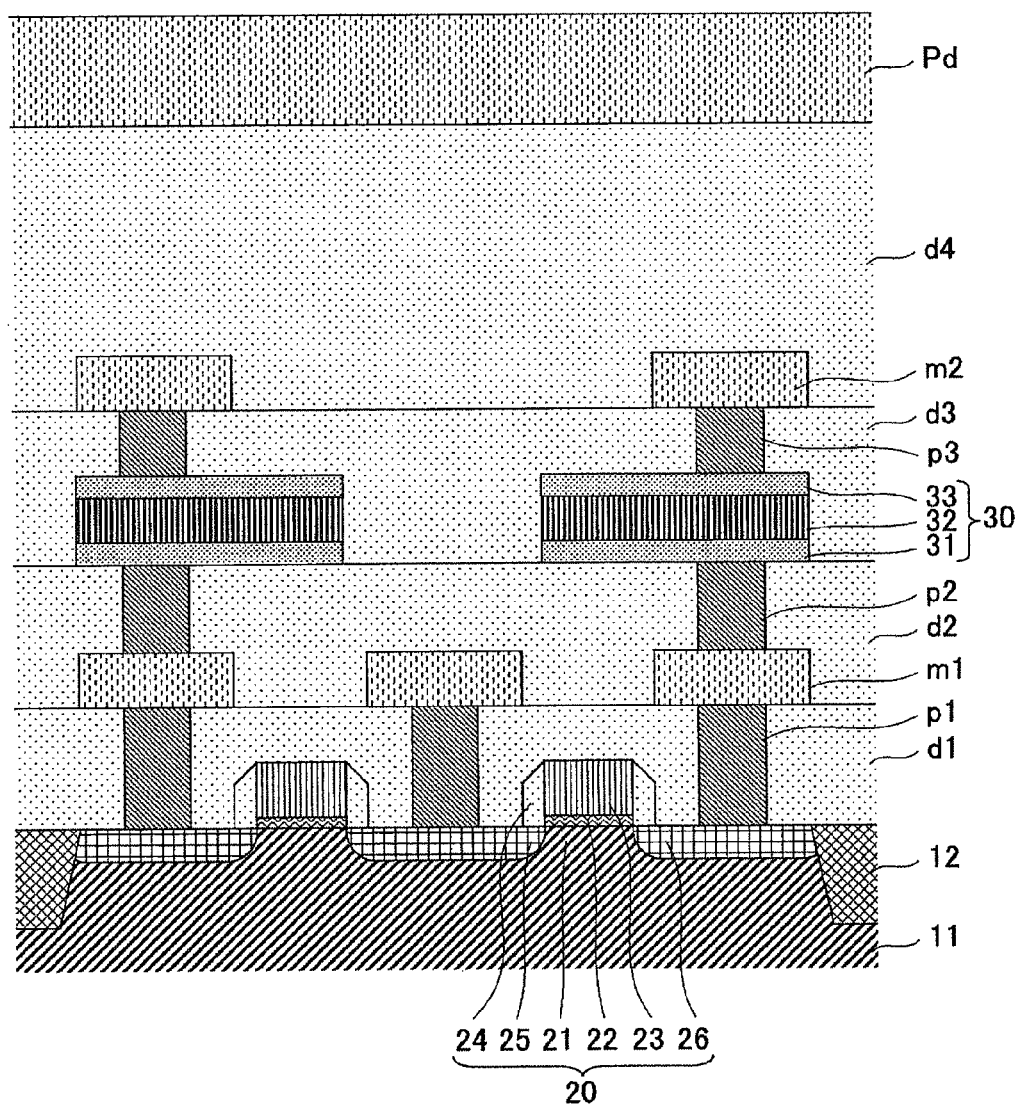
FIG. 10 is an illustrative drawing showing a semiconductor device according to a fourth embodiment.

In the following, a description will be given of an example of a semiconductor device having the capacitor device described above. FIG. 10 is an illustrative drawing showing a cross-sectional view of a semiconductor device provided with a structure corresponding to the capacitor device 100. In FIG. 10, a semiconductor device 10 is formed on a substrate 11 that is made of a semiconductor material such as Si. Device isolation insulating films 12 are formed in the substrate 11 through STI (shallow trench isolation) or the like. A device placement area defined by the device isolation insulating films 12 has a semiconductor device 20 constituting a MOS transistor, for example.

The semiconductor device (MOS transistor) 20 includes a channel 21 formed in the device placement area, a gate insulating film 22 formed on the channel 21, and a gate electrode 23 formed on the gate insulating film 22. On the side walls of the gate electrode 23 are provided sidewall insulating films 24. Impurity areas 25 and 26 (i.e., source area or drain area)

having a conduction type different from that of the substrate 11 (channel 21) are formed in the substrate 11 on both sides of the gate electrode 23, thereby forming a MOS transistor.

Further, an insulating layer (i.e., inter-later insulating layer) d1 is formed such as to cover the MOS transistor 20. Insulating layers (i.e., inter-later insulating layers) d2, d3, and d4 are further formed in this order on the insulating layer d1. Moreover, a plug p1 is formed such as to penetrate the insulating layer d1 so as to be coupled to the impurity area 26 (impurity area 25). The end of the plug p1 opposite to the end coupled to the impurity area 26 is coupled to a pattern interconnect m1. The insulating layer d2 is formed such as to cover the pattern interconnect m1. A plug p2 is formed such as to penetrate the insulating layer d2 so as to be coupled to the pattern interconnect m1.

A dielectric layer 32 is formed between a lower electrode 31 and an upper electrode 33 on the insulating layer d2, thereby forming a capacitor device (memory device) 30. The lower electrode 31 is coupled to the plug p2, and the upper electrode 33 is coupled to a plug p3 penetrating the insulating layer d3 that is formed to cover the capacitor device 30.

A pattern interconnect m2 is formed on the insulating layer d3, with the insulating layer d4 formed on the pattern interconnect m2. An electrode pad Pd is formed on the insulating layer d4. All of these together constitute the semiconductor device 10. In the semiconductor device 10, the MOS transistor 20 provides a switching function with respect to the capacitor device 30.

In the configuration described above, the plugs p1, p2, and p3 may be made of W, but may as well be implemented by use of Cu. The pattern interconnects m1 and m2 may be made of Al, but may alternatively be implemented by use of Cu. The number of layers of multilayer interconnects coupled to the capacitor device may be changed as appropriate.

In the configuration described above, the lower electrode 31 corresponds to the lower electrode 102 of the first embodiment, the dielectric layer 32 to the dielectric layer 103, and the upper electrode 33 to the upper electrode 104. Namely, the dielectric layer 32 is configured to have a composition $(Ba_{1-x}, Sr_x)Ti_{1-z}Sc_yO_{3+\delta}$ (here, $0<x<1$, $0.01<z<0.3$, $0.005<y<0.02$, $-0.5<\delta<0.5$). Accordingly, the capacitor device 30 of the semiconductor device 10 described above provides sufficient reliability and large volume density.

The capacitor device of the present invention is not limited to semiconductor device application, but can be used in various electronic components and electronic devices.

Further, the present invention is not limited to these embodiments, but various variations and modifications may be made without departing from the scope of the present invention.

What is claimed is:

1. A capacitor device, comprising:
a dielectric layer configured to have a composition represented as $(Ba_{1-x}, Sr_x)Ti_{1-z}Sc_yO_{3+\delta}$ ($0<x<1$, $0.01<z<0.3$, $0.005<y<0.02$, $-0.5<\delta<0.5$) and an in-plane deformation $\in$ of crystal that satisfies $-0.4<\in<0.4$;
an upper electrode and a lower electrode that are placed on respective sides of the dielectric layer; and
a substrate on which the upper electrode, the lower electrode, and the dielectric layer are disposed.

2. The capacitor device as claimed in claim 1, wherein the upper electrode includes a plurality of layers, the plurality of layers including a metal oxide layer having direct contact with the dielectric layer.

3. The capacitor device as claimed in claim 2, wherein a metal oxide constituting the metal oxide layer includes at least one of $IrO_x$, $SrRuO_x$, $PtO_x$, and $AuO_x$.

4. The capacitor device as claimed in claim 1, further comprising an adhesive layer formed between the substrate and the lower electrode, the adhesive layer including at least one of precious metal, precious metal alloy, a conductive oxide of precious metal, metal oxide, and metal nitride.

5. The capacitor device as claimed in claim 4, wherein the adhesive layer includes at least one of Pt, Ir, Zr, Ti, $TiO_x$, $IrO_x$, $PtO_x$, TiN, TiAlN, TaN, and TaSiN.

6. The capacitor device as claimed in claim 1, wherein the lower electrode includes at least one of Pt, Pd, Ir, Ru, Rh, Re, Os, Au, Ag, Cu, $PtO_x$, $IrO_x$, and $RuO_x$.

7. The capacitor device as claimed in claim 1, wherein the upper electrode includes at least one of Pt, Pd, Ir, Ru, Rh, Re, Os, Au, Ag, Cu, $PtO_x$, $IrO_x$, $RuO_x$, $SrRuO_x$, and $LaNiO_x$.

8. The capacitor device as claimed in claim 1, wherein the dielectric layer includes no less than 1000 ppm of at least one of Al, Fe, Mn, Ni, Co, Mg, Lu, Er, Y, Ho, Dy, Gd, and Tm.

9. A semiconductor device, comprising:
a semiconductor element formed in a substrate made of a semiconductor material; and
a capacitor device coupled to the semiconductor element, the capacitor device including a dielectric layer, an upper electrode, and a lower electrode, the dielectric layer configured to have a composition represented as $(Ba_{1-x}, Sr_x)Ti_{1-z}Sc_yO_{3+\delta}$ ($0<x<1$, $0.01<z<0.3$, $0.005<y<0.02$, $-0.5<\delta<0.5$) and an in-plane deformation $\in$ of crystal that satisfies $-0.4<\in<0.4$, and the upper electrode and the lower electrode being placed on respective sides of the dielectric layer.

10. A method of making a capacitor device, comprising:
forming a lower electrode on a substrate;
forming a dielectric layer having a composition represented as $(Ba_{1-x}, Sr_x)Ti_{1-z}Sc_yO_{3+\delta}$ ($0<x<1$, $0.01<z<0.3$, $0.005<y<0.02$, $-0.5<\delta<0.5$) and an in-plane deformation $\in$ of crystal that satisfies $-0.4<\in<0.4$; and
forming an upper electrode on the dielectric layer.

* * * * *